United States Patent [19]

Kim

[11] Patent Number: 5,534,450
[45] Date of Patent: Jul. 9, 1996

[54] METHOD FOR FABRICATION A SEMICONDUCTOR DEVICE

[75] Inventor: Jae K. Kim, Kyoungki-do, Rep. of Korea

[73] Assignee: Hyundai Electronics Industries Co., Ltd., Kyoungki-do, Rep. of Korea

[21] Appl. No.: 434,280

[22] Filed: May 3, 1995

[30] Foreign Application Priority Data

May 4, 1994 [KR] Rep. of Korea .................... 94-9838

[51] Int. Cl.⁶ ........................................... H01L 21/8238
[52] U.S. Cl. ............................................... 437/34; 437/57
[58] Field of Search .......................... 437/34, 56, 57, 437/58, 62, 67

[56] References Cited

U.S. PATENT DOCUMENTS

| | | | |
|---|---|---|---|
| 4,593,459 | 6/1986 | Poppert et al. | 437/62 |
| 4,808,548 | 2/1989 | Thomas et al. | 437/56 |
| 4,927,777 | 5/1990 | Hsu et al. | 437/34 |
| 5,015,594 | 5/1991 | Chu et al. | 437/57 |
| 5,356,822 | 10/1994 | Lin et al. | 437/34 |

FOREIGN PATENT DOCUMENTS 1243446  9/1989  Japan ................................. 437/34

*Primary Examiner*—Tom Thomas
*Assistant Examiner*—Michael Trinh
*Attorney, Agent, or Firm*—Morgan & Finnegan

[57] ABSTRACT

There is disclosed a semiconductor device remarkably reduced in the area of the element isolation region and in the area of the substrate electrode, thereby contributing to high integration, which comprises a P type semiconductor substrate containing an N well and a P well and a trench element isolation film therein, the trench element isolation film being between the N well and P well, a P-MOSFET and an N-MOSFET established in each N well and P well, respectively, and an N type substrate electrode which is formed in contact with the source electrode of the P-MOSFET and is applied by $V_{DD}$ voltage.

5 Claims, 5 Drawing Sheets

METHOD FOR FABRICATION A SEMICONDUCTOR DEVICE

BACKGROUND OF THE INVENTION

1. Field of the Invention

The present invention relates, in general, to a semiconductor device and, more particularly, to a CMOS device which is remarkably reduced in the area of the element isolation region between an N well and P well and in the area of the substrate electrode. Also, the present invention is concerned with a method for fabricating the semiconductor device.

2. Description of the Prior Art

Generally, a semiconductor device consisting of a transistor and a capacitor generally forms one independent element in an integrated circuit and so it requires an element isolation region between active regions to prevent the elements from interfering with one another in their operations.

The recent trend of high integration of semiconductor devices has compelled many efforts to reduce the element isolation region, which generally occupies much area in a semiconductor device. Many processes for this purpose have been developed. Representative are a local oxidation of silicon (LOCOS) process and a selective polysilicon oxidation (SEPOX) process. In the LOCOS process, an element isolation oxide film is formed by thermal oxidation of a semiconductor substrate in the presence of a mask of nitride film pattern that locally exposes the semiconductor substrate. Likewise, the SEPOX process comprises thermal oxidation of a semiconductor substrate in the presence of a mask consisting of a combination of polysilicon film and nitride film pattern that locally exposes the semiconductor substrate. Apart from these processes, there is a process in which a trench is formed by selective etch of a semiconductor substrate and then filled with an insulating material, so as to form a trench element isolation oxide film. Of the above-illustrated processes, the LOCOS process is most widely used because of its relative simplicity.

In order to better understand the background of the invention, a description of the LOCOS process will be given. To begin with, the surface of a silicon semiconductor substrate is thermally oxidized to grow a pad oxide film. Then, a nitride film pattern is formed on the pad oxide film, to expose a predetermined area of the semiconductor substrate which is destined to be an element isolation region. Finally, another thermal oxidation is applied to the semiconductor substrate to grow a field oxide film with the nitride pattern serving as a mask.

However, this LOCOS process has a problem known as bird's beak wherein the field oxide film encroaches the active region, resulting in a reduction in the area of the active region. In addition, when a subsequent exposure process is carried out in order to form a photosensitive film pattern, light is reflected from the slanted surface of the bird's beak, so as to illuminate the photosensitive film undesirably. As a result, the problem of notching is generated. These problems cause degradation of production yield and reliability when a gate poly is patterned in a semiconductor device under the design rule of 0.4 µm or less.

Referring to FIG. 1, there is a circuit diagram showing a typical CMOS device comprising an N type MOSFET and a P type MOSFET which are connected to each other. As shown in FIG. 1, the source electrodes (S) of the PMOS and NMOS are connected with $V_{DD}$ and $V_{SS}$, respectively, and the drain electrodes (D)2 thereof are connected to each other.

With reference to FIG. 2, there is a layout of main masks in which an N well mask 1, active masks 2, a gate mask 3, contact hole masks 4, and wiring masks 5 are conventionally arranged to fabricate the circuit of FIG. 1.

FIG. 3 shows a semiconductor device fabricated by the conventional technique taken through line I—I of FIG. 2. Its fabrication processes starts with the formation of a P well 12 and an N well in predetermined areas of a P type semiconductor substrate 11 by use of a P well mask (not shown) and the N well mask 1, respectively. Then, element isolation films 14 are formed at the boundary between the two wells and at predetermined areas of the wells. A gate oxide film 15 is formed over each well, followed by the formation of a gate electrode 16 over the gate oxide film by use of the gate mask 3. While this gate structure serves as a mask, N type impurities are implanted into the P well 12 whereas P type impurities are implanted into the N well 13. As a result, a set of source electrodes 17 and drain electrodes 18 is established in each well. A voltage of $V_{SS}$ is applied to the P type semiconductor substrate 11. In order to supply a voltage of $V_{DD}$ for the N well 13, a substrate electrode 19 is established by implanting N type impurities into a region which is separated by the source electrode 17A and the element isolation oxide film 14 in the N well 13. Thereafter, a blanket interlayer insulting film is coated over such MOSFET structures. This blanket film is patterned by an etch process using the contact hole masks 4, to form a pattern of interlayer insulating film 21 containing contact holes 20 through which the source electrodes 17A, 17B and drain electrodes 18A, 18B and the substrate electrode 19 are exposed. The wiring masks 5 are used to form three wirings 22. One is to connect the source electrode 17A and substrate electrode 19 of P-MOSFET with $V_{DD}$, another for connection between the drain electrode 18A of P-MOSFET and the drain electrode 18B of N-MOSFET, and the other for the source electrode 17B of N-MOSFET and $V_{SS}$.

As previously mentioned, the element isolation oxide film for isolating the N-MOSFET from the P-MOSFET, if fabricated by LOCOS, occupies much area. The above-illustrated conventional technique has another difficulty in achieving high integration of a semiconductor device because the additionally formed substrate electrode is separated from the source electrode of the P-MOSFET by the element isolation oxide film, which leads to consumption of too much area.

SUMMARY OF THE INVENTION

It is therefore a principal object of the present invention to overcome the above problems encountered in the prior art and to provide a semiconductor device having a new structure contributing to high integration.

It is another object of the present invention to provide a method for fabricating the semiconductor device.

In accordance with an aspect of the invention, there is provided a semiconductor device, comprising: a P type semiconductor substrate containing N wells and P wells and trench element isolation films therein, each of said trench element isolation films being between the N well and P well; a P-MOSFET and an N-MOSFET established in each N well and P well, respectively; and an N type substrate electrode which is formed at a certain part of the source electrode of the P-MOSFET and is applied by $V_{DD}$ voltage.

In accordance with another aspect of the invention, there is provided a method for fabricating a semiconductor device, comprising the steps of: forming N wells and P wells at their predetermined portions in a P type semiconductor substrate; forming a trench filled with an insulating material at the boundary between the N well and P well, said trench serving as an element isolator for said wells; establishing a gate structure over each N well and P well, said gate structure being a stack of a gate oxide film, a gate electrode and a first insulating film pattern; implanting impurities into the N well and the P well, to form their respective source electrodes and drain electrodes, said impurities having a type opposite to the well to be implanted; depositing a second insulating film and an etch stopper over the resulting structure, in sequence; forming an insulating spacer at a side wall of said etch stopper, said side wall being attributed to said stack structure; implanting N type impurities into a part of the source electrode of the P-MOSFET in the presence of a photosensitive film pattern, to form an N type substrate electrode, said photosensitive film pattern covering all structure but said source electrode which has partly been uncovered by said insulating spacer; removing said photosensitive film pattern and coating a blanket third insulating film upon the resulting structure; selectively etching the third insulating film by use of contact masks, to form contact holes through which said source electrodes, said drain electrodes and said substrate electrodes of the P well are exposed; and forming a wiring pattern in which the source electrode and said substrate electrode of the P well are connected with $V_{DD}$, the drain electrode of the P well is connected with the drain electrode of the N well and the source electrode of the N well is connected with $V_{SS}$.

BRIEF DESCRIPTION OF THE DRAWINGS

The above objects and other advantages of the present invention will become more apparent by describing in detail the preferred embodiments of the present invention with reference to the attached drawings in which.

DETAILED DESCRIPTION OF THE PREFERRED EMBODIMENTS

Figure 1:
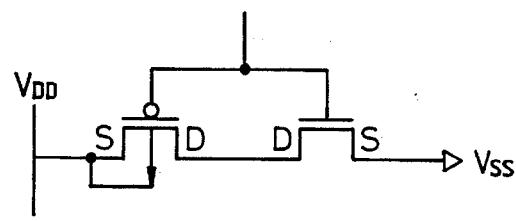
FIG. 1 is a CMOS circuit diagram showing a typical CMOS device comprising an N type MOSFET and a P type MOSFET which are connected to each other.
Figure 2:
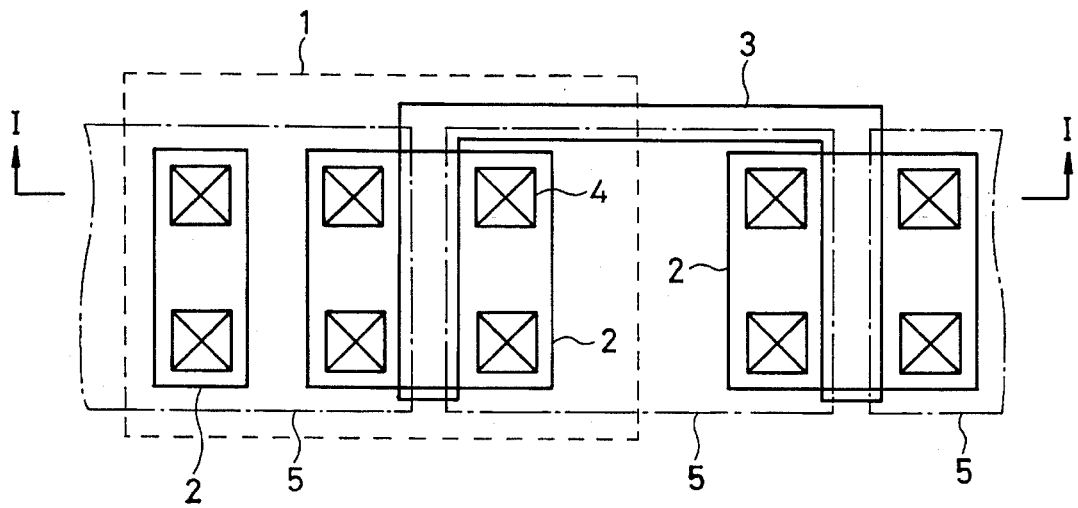
FIG. 2 is a layout of masks which are conventionally arranged to fabricate the circuit of FIG. 1.

The application of the preferred embodiments of the present invention is best understood with reference to the accompanying drawings, wherein like reference numerals are used for like and corresponding parts, respectively.

Figure 4:
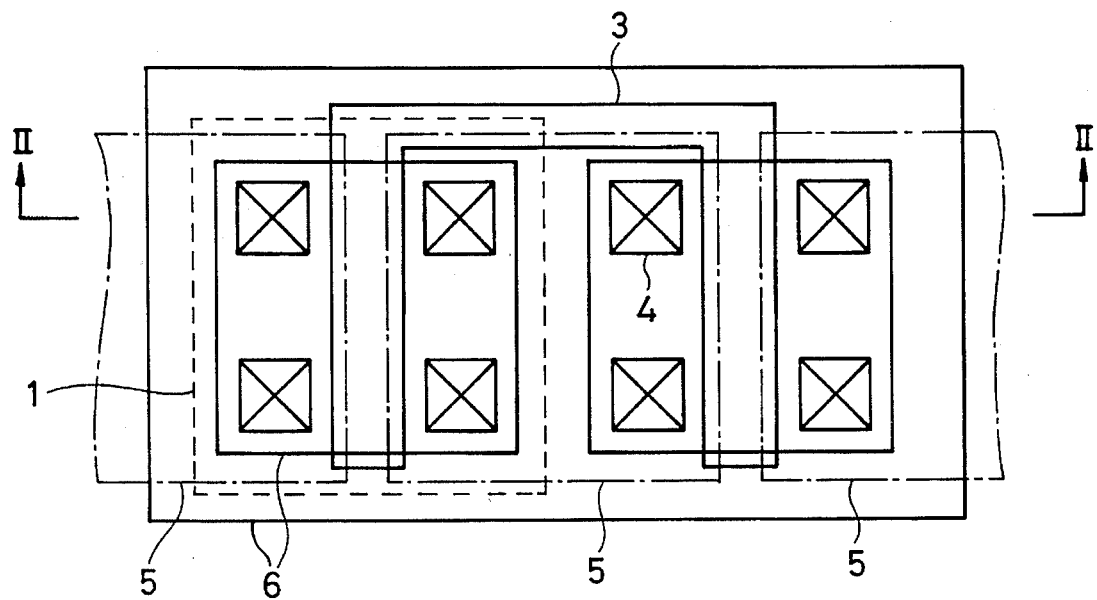
FIG. 4 is a layout of masks which are arranged to fabricate the circuit of FIG. 1, according to the present invention.

Referring to FIG. 4, there is a layout of masks in which an N well masks 1, a gate mask 3, contact hole masks 4, wiring masks 5 and trench masks 6 are newly arranged to fabricate the circuit of FIG. 1. The square areas inside the trench masks 6 are the active regions.

Figure 3:
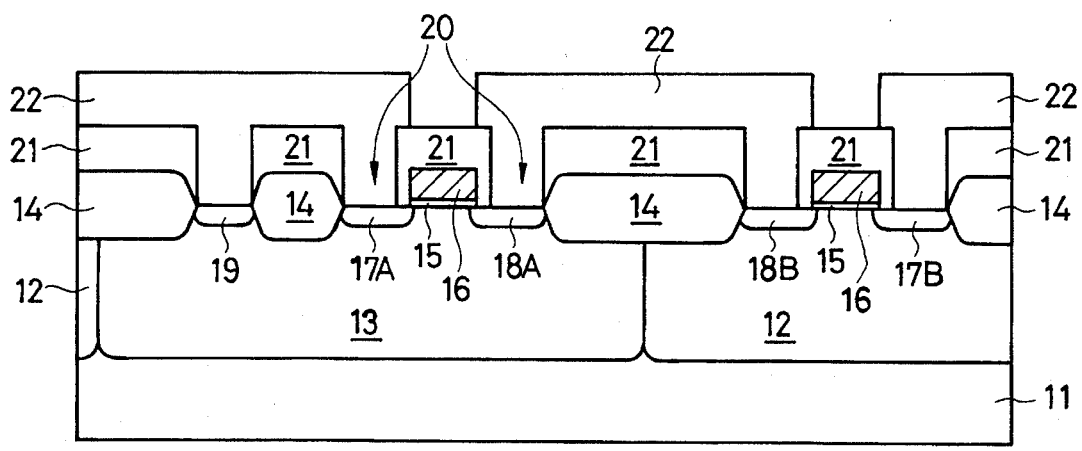
FIG. 3 is a schematic cross sectional view showing a conventional semiconductor device which is fabricated by use of the combination of masks of FIG. 2, taken through line I—I of FIG. 2.
Figure 5:
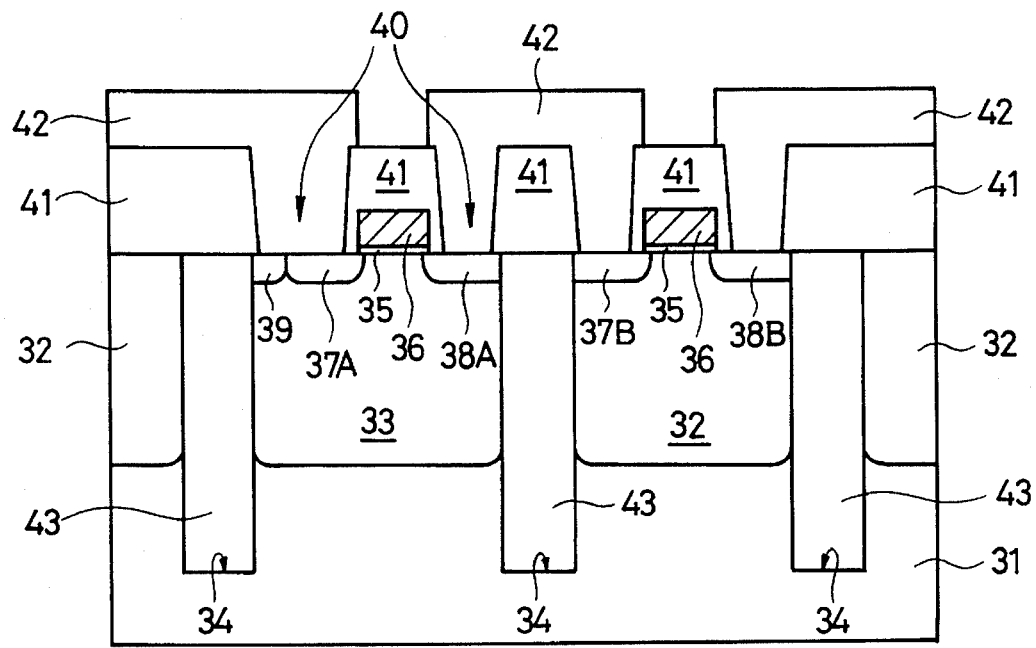
FIG. 5 is a schematic cross sectional view showing a semiconductor device which is fabricated by use of the combination of masks of FIG. 4, taken through line II—II of FIG. 4.

With reference to FIG. 5, there is a semiconductor device fabricated according to the present invention, taken through line II—II of FIG. 4. As will be further described, this present semiconductor device is quite different from the conventional one in a few aspects. First, instead of field oxide film, a trench is adopted as an element isolator. Unlike the conventional semiconductor device of FIG. 3, P wells 32 and N wells 33 are formed in a semiconductor substrate 31 and a trench 34 that is about 0.3 to 3.0 μm wide and about 1.5 to 10 μm deep is formed between N well and P well. This trench 34 is filled with an insulating material, to form a buried layer with the aim of isolating the elements from each other. Accordingly, the area of a semiconductor substrate occupied by the element isolator is much minimized through the trench. Another distinctive difference is the position of the substrate electrode. In the conventional semiconductor device, as illustrated above, the substrate electrode is formed away from the source and drain electrodes of the P-MOSFET at the N well region. In contrast with the conventional semiconductor device, the present semiconductor device comprises a substrate electrode 39 which is formed in contact with a source electrode 37A of the P-MOSFET. Accordingly, the element isolation oxide film, which is necessary to separate the substrate electrode from the source and drain electrodes of the P-MOSFET, is unnecessary in the present invention. Consequently, the present semiconductor device can secure more area.

FIG. 6 shows the preferred process steps for fabrication of the semiconductor device of FIG. 5. These preferred steps will be described in more detail in connection with FIGS. 6A through 6E.

Figure 6A:
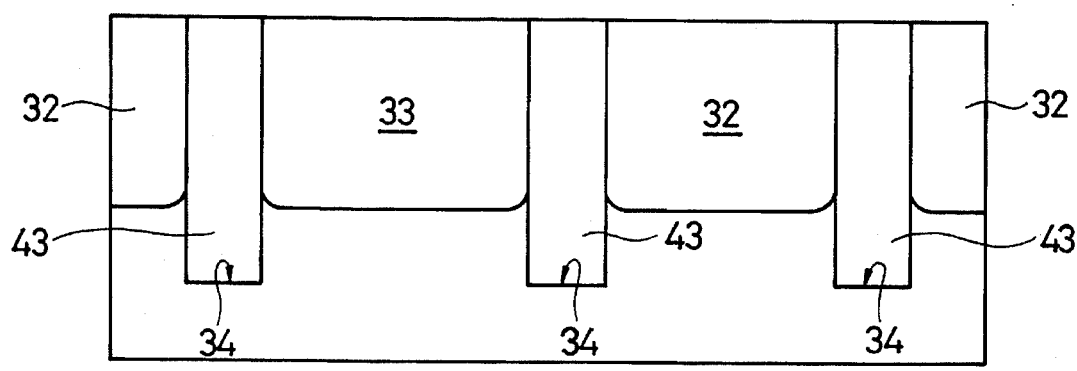
FIGS. 6A through 6E are schematic cross sectional views illustrating a method for fabricating the semiconductor device, according to the present invention.

With reference to FIG. 6A, there is a semiconductor substrate 31 in which a P well 32 and an N well alternate and a trench 34 is formed therebetween. The P well 32 and N well 33 are formed in their respective predetermined areas of the semiconductor substrate 31 by use of the N well mask (designated by reference numeral "1" in FIG. 4) and a P well mask (not shown). As for the trench, the trench mask (designated by reference numeral "6" in FIG. 4) is used to etch a predetermined depth of the semiconductor substrate 31. The trench thus formed is filled with an insulating material, for example, an oxide film, to form a buried layer 43.

Figure 6B:
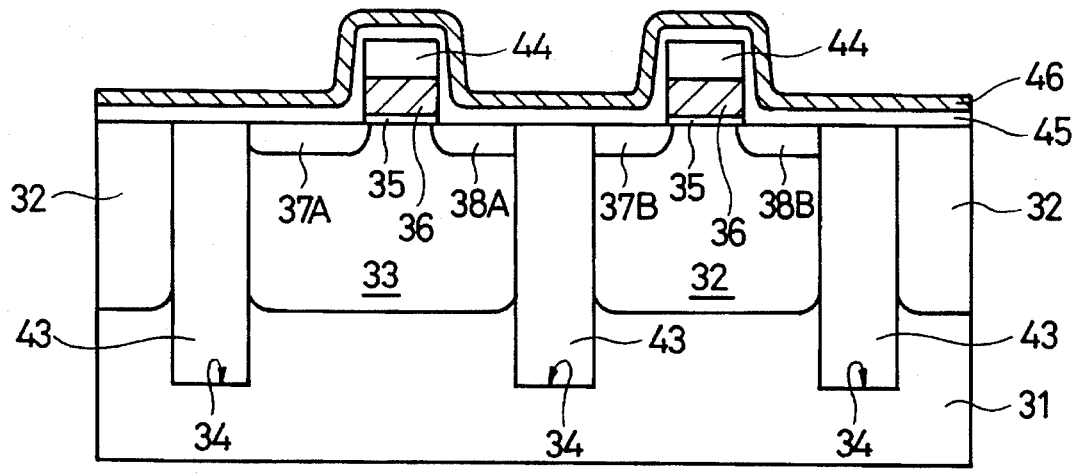

With reference to FIG. 6B, a structure of the N-MOSFET and P-MOSFET is established for the moment. For this, first, a gate oxide 35 is grown upon the entire surface of the resulting structure of FIG. 6A, followed by the sequential formation of a conductive layer and a first insulating film over the gate oxide 35, which all then are subjected to an etch process using the gate mask (designated by reference numeral "3" of FIG. 4), to form a gate electrode 36 over both the P well 32 and the N well 33. N type impurities are implanted into the P well 32, to form a source electrode 37B and a drain electrode 38B with the gate electrode 36 serving as a mask. Likewise, the N well 33 is doped with P type impurities, to form a source electrode 37A and a drain electrode 38A. Over these resulting N-MOSFET and P-MOSFET structures, a second insulating film 45, a relatively thin oxide film, and an etch stopper 46 are formed, in sequence. The etch stopper 46 is a film which differs from the second insulating film 45 in etch selection rate, for example, a nitride film.

Figure 6C:
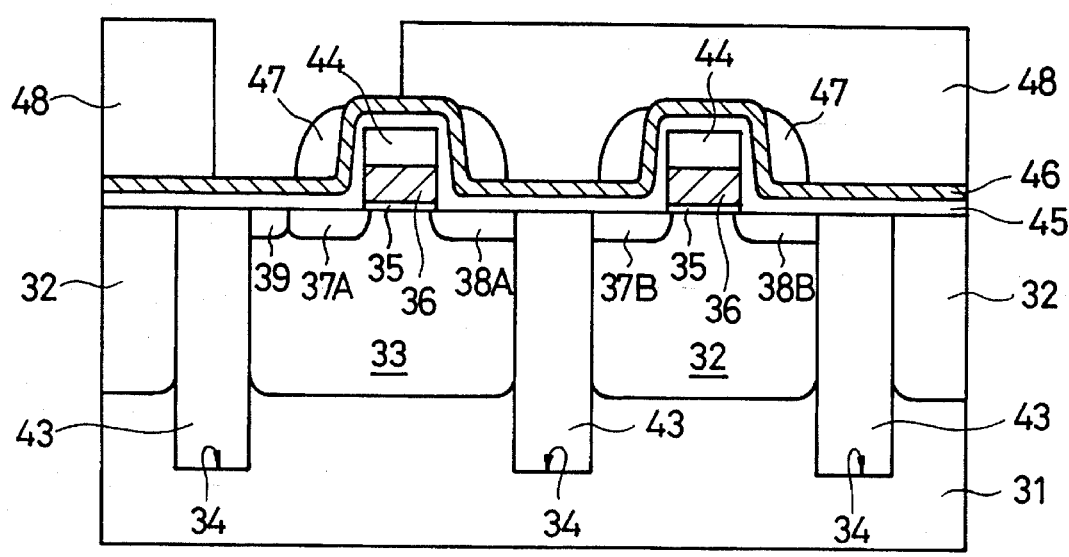

With reference to FIG. 6C, insulating spacers 47 are formed at the side walls of the etch stopper 46, which side walls are attributable to the stack structure consisting of the gate electrode 36 and the first insulating film 44, and a photosensitive film pattern 48 is formed to expose only the source electrode 37A of P-MOSFET which has been partly uncovered by the insulating spacer 47, followed by implantation of N type impurities into the exposed area of the source electrode 37A. As a result of this implantation, an N type substrate electrode 39 forms in contact with the source electrode 37A. This substrate electrode 39 is self-aligned by the photosensitive film pattern 48 and the insulating spacer 47.

Figure 6D:
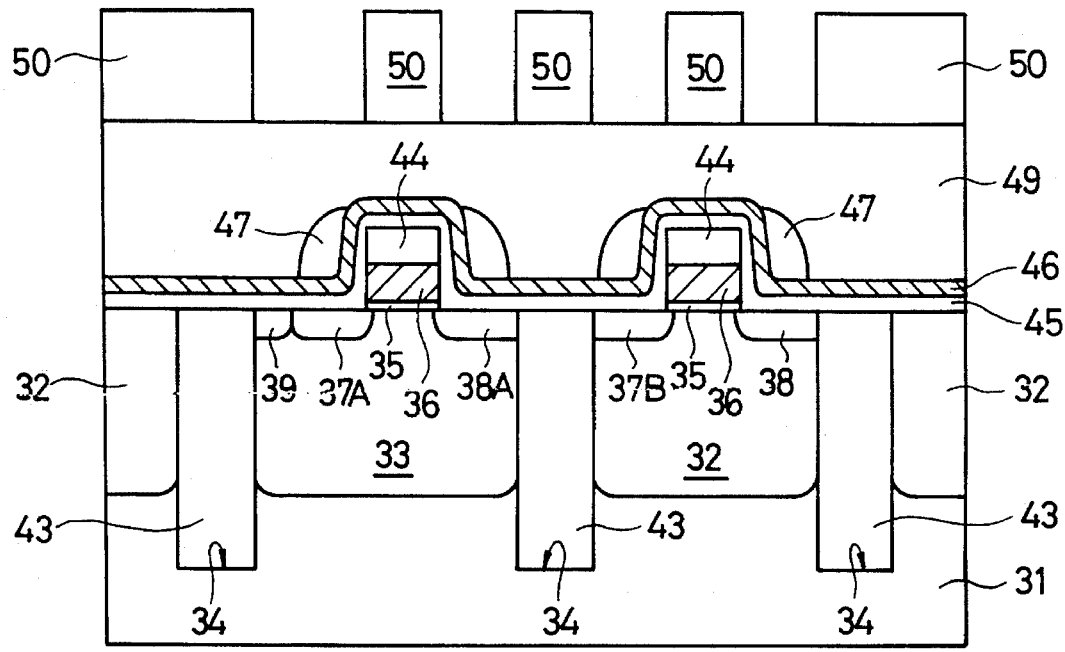

With reference to FIG. 6D, following removal of the photosensitive film pattern 48, a blanket third insulating layer 49, i.e. BPSG (boro phospho silicate glass), is formed, with the aim of planarizing the resulting structure, which is then covered with a photosensitive film pattern 50. As to this photosensitive film pattern 50, a photosensitive film is formed entirely over the planarized surface and subjected to exposure and development by means of the contact hole masks (designated as reference numeral "4" in FIG. 4), to open predetermined areas thereof.

Figure 6E:
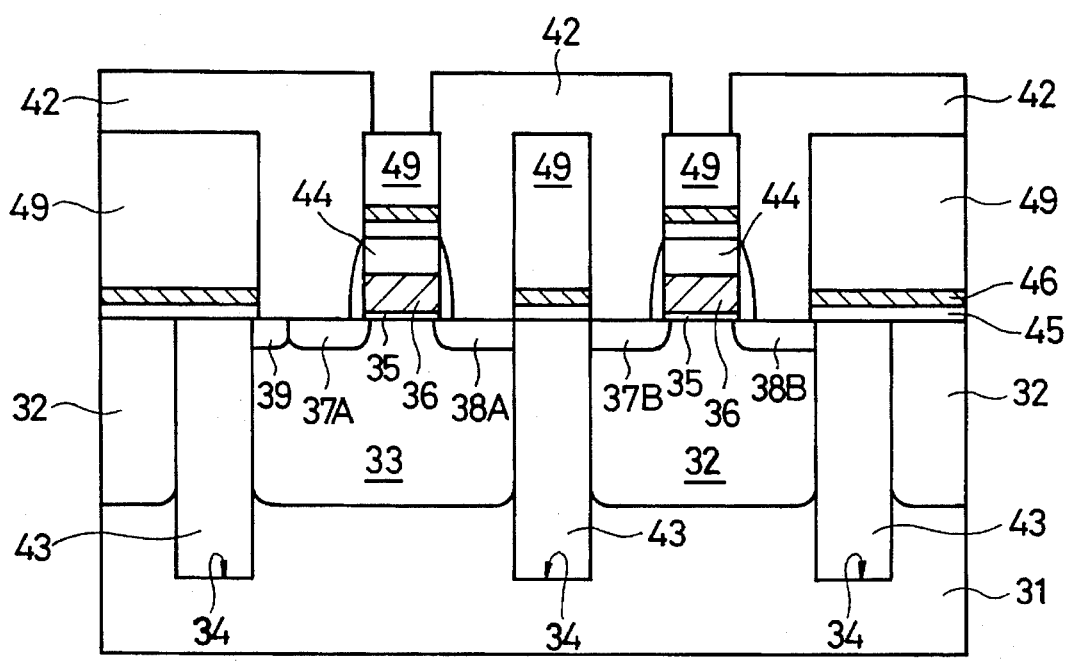

With reference to FIG. 6E, the photosensitive film pattern 50 serving as a mask, the multiplicate structure ranging from the planarization layer 49 to the second insulating film 45 is selectively etched, to form contact holes through which the source electrodes 37A, 37B, the drain electrodes 38A, 38B and the substrate electrode 39 are exposed and, following removal of the photosensitive film pattern 50, there are formed wirings 42 that play a role in interconnecting the various electrodes and external voltages: connection of the source electrode 37A and the substrate electrode 39 of a P-MOSFET with $V_{DD}$; connection between the drain electrode 38A of a P-MOSFET and the drain electrode 38B of N-MOSFET; and connection between the source electrode 17B of a N-MOSFET and $V_{SS}$. These wirings 42 are formed by depositing a blanket conductive layer and patterning it by use of the wiring masks (designated as reference numeral "∓5" in FIG. 4).

As described hereinbefore, the element isolation region, usually occupying much area in a semiconductor device, can be significantly reduced in area by constructing a trench filled with insulating material between the P well and N well formed in a semiconductor substrate, in accordance with the present invention. This reduction of area in an element isolation region contributes to achieving high integration of a semiconductor device. In addition, the semiconductor device according to the present invention comprises a substrate electrode which is formed by implanting N type impurities into a part of the source electrode of P-MOSFET and thus, is further reduced in area.

Other features, advantages and embodiments of the invention disclosed herein will be readily apparent to those exercising ordinary skill after reading the foregoing disclosures. In this regard, while specific embodiments of the invention have been described in considerable detail, variations and modifications of these embodiments can be effected without departing from the spirit and scope of the invention as described and claimed.

What is claimed is:

1. A method for fabricating a semiconductor device, comprising the steps of:

forming an N well and a P well at predetermined portions in a P type semiconductor substrate;

forming a trench filled with an insulating material at the boundary between the N well and the P well, said trench serving as an element isolator for said wells;

establishing a gate structure over each N well and P well, said gate structure comprising a stack of a gate oxide film, a gate electrode and a first insulating film pattern;

implanting impurities into the N well and the P well to form their respective source electrodes and drain electrodes, said impurities having a type opposite to the well to be implanted;

depositing a second insulating film and an etch stopper over the resulting structure, in sequence;

forming an insulating spacer at a side wall of said etch stopper, said side wall being attributed to said stack;

implanting N type impurities into a part of the source electrode of a P-MOSFET in the presence of a photosensitive film pattern to form an N type substrate electrode, said photosensitive film pattern covering all structure but said source electrode which has partly been uncovered by said insulating spacer;

removing said photosensitive film pattern and coating a blanket third insulating film upon the resulting structure;

selectively etching the third insulating film by use of contact masks to form contact holes through which said source electrodes, said drain electrodes and said substrate electrodes of the P well are exposed; and forming a wiring pattern in which the source electrode and said substrate electrode of the P well are connected with a $V_{DD}$, the drain electrode of the P well is connected with the drain electrode of the N well and the source electrode of the N well is connected with a $V_{SS}$.

2. A method in accordance with claim 1, wherein said photosensitive film pattern is formed by depositing a blanket photosensitive film and selectively etching it so as to expose the source electrode of the P well and a part of the gate electrode adjacent to said source electrode.

3. A method in accordance with claim 1, wherein said trench is about 0.3 to about 3 μm wide and about 1.5 to 10 μm deep.

4. A method in accordance with claim 1, wherein said trench is filled with an oxide film.

5. A method in accordance with claim 1, wherein said etch stopper is made of a nitride film and said third insulating film is made of boro phospho silicate glass.

* * * * *